(12) United States Patent
Pritchard et al.

(10) Patent No.: US 12,555,934 B2
(45) Date of Patent: Feb. 17, 2026

(54) SYSTEM AND METHOD FOR CABLED POWER USING STRAIN RELIEF CONNECTORS

(71) Applicant: Dell Products L.P., Round Rock, TX (US)

(72) Inventors: Jason Pritchard, Hopkinton, MA (US); Stephen Edward Strickland, Foxborough, MA (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 469 days.

(21) Appl. No.: 18/318,462

(22) Filed: May 16, 2023

(65) Prior Publication Data

US 2024/0388021 A1  Nov. 21, 2024

(51) Int. Cl.
*H01R 12/70* (2011.01)
*H01R 12/72* (2011.01)
*H01R 13/585* (2006.01)

(52) U.S. Cl.
CPC ....... *H01R 12/7047* (2013.01); *H01R 12/725* (2013.01); *H01R 13/585* (2013.01)

(58) Field of Classification Search
CPC ............ H01R 12/7088; H01R 12/7047; H01R 12/725; H01R 13/585; H05K 1/142; H05K 3/368

USPC .................................................... 439/79, 325
See application file for complete search history.

(56) References Cited

U.S. PATENT DOCUMENTS

| | | | | |
|---|---|---|---|---|
| 6,305,953 | B1 * | 10/2001 | Shi ..................... | H01R 13/6583 |
| | | | | 439/573 |
| 2010/0009555 | A1 * | 1/2010 | Zhu ....................... | H01R 12/725 |
| | | | | 439/59 |
| 2023/0009150 | A1 * | 1/2023 | Chen ..................... | H05K 1/144 |
| 2023/0081766 | A1 * | 3/2023 | Huang ................. | H05K 7/1487 |
| | | | | 174/255 |

* cited by examiner

*Primary Examiner* — Tulsidas C Patel
*Assistant Examiner* — Carlos E Lopez-Pagan
(74) *Attorney, Agent, or Firm* — McDermott Will & Schulte LLP

(57) ABSTRACT

In one or more embodiments, one or more systems may comprise a system for leveraging a strain relief connector in a board connector or providing electrical power to a printed circuit board (PCB) retained in the board connector. A surface of the PCB is formed with a contact pad and a via is connected to the contact pad. The PCB is positioned in a first slot in the board connector and an electrically conductive bracket is positioned in a second slot in a strain relief connector. A bolt is advanced in a threaded passage to secure the PCB and the electrically conductive bracket in the board connector, wherein the electrically conductive bracket, the bolt and the contact pad form an electrical path from the electrical connector to the via in the PCB.

18 Claims, 6 Drawing Sheets

SYSTEM AND METHOD FOR CABLED POWER USING STRAIN RELIEF CONNECTORS

BACKGROUND

Field of the Disclosure

This disclosure relates generally to information handling systems and more particularly to leveraging strain relief connectors to provide cabled power to a printed circuit board (PCB).

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be generally directed to a system for providing electrical power to a one or more printed circuit boards (PCB). Embodiments may comprise a power pad formed on a surface of a first PCB, a via formed through a portion of the first PCB for electrically connecting the power pad to a power plane in the first PCB, a board connector configured to couple the first PCB to a second PCB, an electrically conductive bracket and a threaded connector. The board connector may comprise a first slot for receiving a first edge of the first PCB, a strain relief connector comprising second slot aligned substantially parallel with the first slot and a threaded passage orthogonal to and intersecting the first slot and the second slot. The electrically conductive bracket may comprise a first end for positioning in the second slot and a second end with an electrical connector. Engaging the threaded connector with the threaded passage advances the threaded connector to secure the electrically conductive bracket and the PCB in the first slot in the board connector, wherein the electrically conductive bracket, the threaded connector, the power pad and the via form an electrical path from the electrical connector to the PCB.

In some embodiments, the electrical connector comprises one of a rail type connector or a screw type connector. In some embodiments, the electrical connector is configured to extend in a direction substantially parallel to the surface of the PCB. In some embodiments, the electrical connector is configured to extend in a direction substantially perpendicular to the surface of the PCB. In some embodiments, the board connector comprises a Small Form Factor (SFF) TA-1002 type connector. In some embodiments, the PCB comprises one of an open compute platform (OCP) card or a floating open compute platform (FLOP) card.

Embodiments may be generally directed to an information handling system comprising a first printed circuit board (PCB), a board connector configured to couple the first PCB to a second PCB, an electrically conductive bracket and a threaded connector. The first PCB may comprise a power pad formed on a surface of the PCB and a via formed through a portion of the PCB for electrically connecting the power pad to a power plane in the PCB. The board connector may comprise a first slot for receiving a first edge of the PCB, a strain relief connector comprising second slot aligned substantially parallel with the first slot and a threaded passage orthogonal to and intersecting the first slot and the second slot, The electrically conductive bracket may comprise a first end for positioning in the second slot and a second end with an electrical connector. Engaging the threaded connector with the threaded passage advances the threaded connector to secure the electrically conductive bracket and the PCB in the first slot in the board connector, wherein the electrically conductive bracket, the threaded connector, the power pad and the via form an electrical path from the electrical connector to the PCB.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
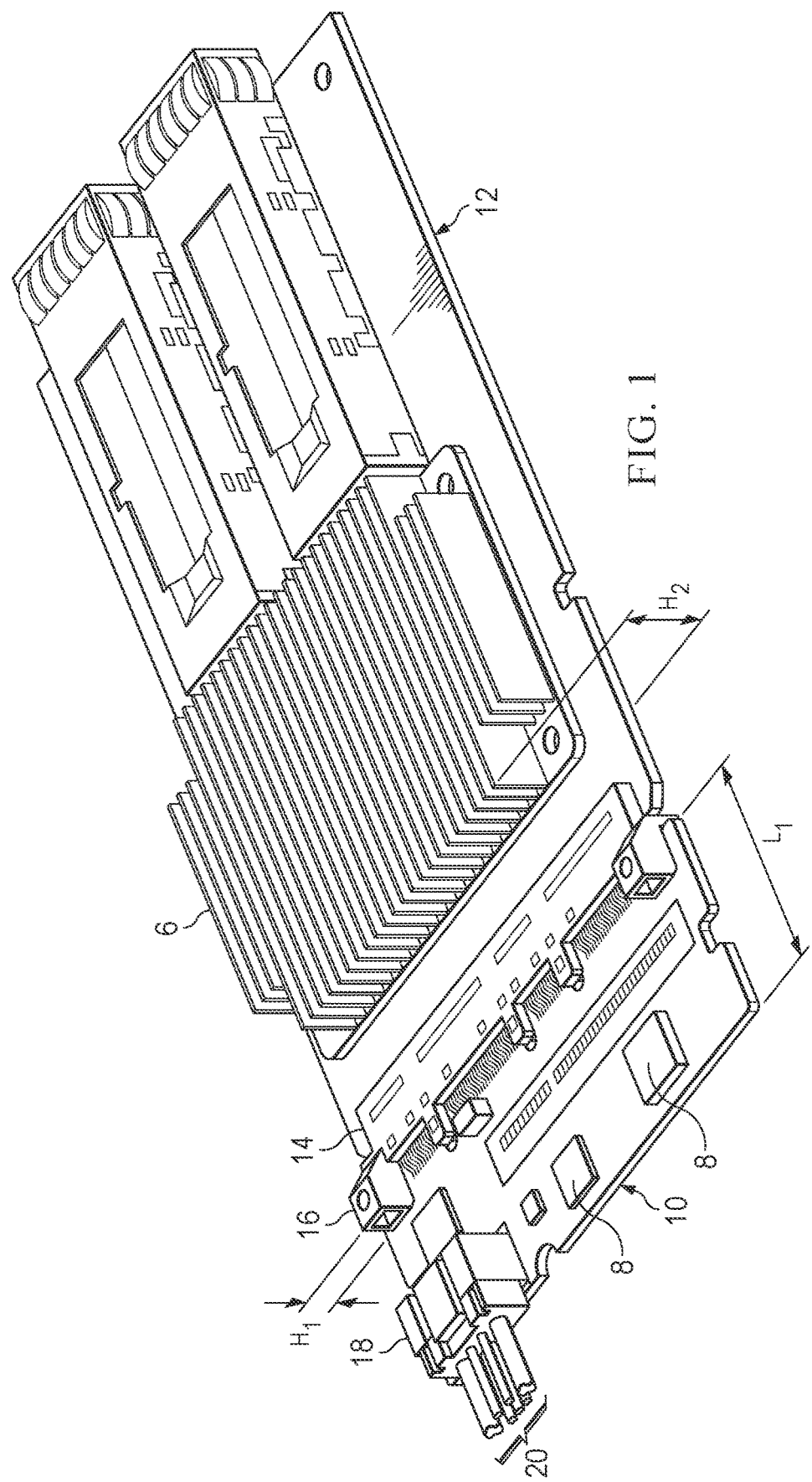
FIG. 1 depicts an example a first printed circuit board (PCB) coupled to a second PCB with a board connector and receiving power from a typical power connector.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

A common compute framework may enable manufacturers to reuse or leverage common software and hardware resources to quickly enable many different products across computing systems. For example, Host Processor Modules (HPMs) provide system designers flexibility by cabling the PCIe ports on an HPM board. Cabled Input/Output (I/O) boards allow system designers to easily position I/O boards and drives anywhere in the system, but this flexibility comes at a cost. For example, routing PCIe cables typically requires significant volume within the box. It is further complicated by the fact that many cables now contain power and active logic to manage end-point devices. These cables that provide flexibility may also affect cooling, density and complexity. Currently, many information handling systems may have OCP cables that contain both high-speed and power connections.

Embodiments disclosed herein may leverage strain relief connectors to provide cabled power delivery to a PCB to enhance system integration for information handling systems, while still providing strain relief for the PCB. Embodiments may accommodate high current requirements without requiring large power connectors. Embodiments may also integrate power connectors into areas that take no additional space on the cable assembly PCB and provide an opportunity to consolidate cabling in the system. Embodiments may further allow for smaller PCBs.

Turning now to FIG. 1, a first printed circuit board (PCB) 10 may be coupled to a second PCB 12 using a board connector 14. Board connector 14 may be, for example, a Small Form Factor (SFF) TA-1002 type connector.

Each of PCB 10 and 12 may also be referred to as "cards." For example, in some embodiments, PCB 12 may be one of an open compute platform (OCP) card, a floating open compute platform (FLOP) card or any primary PCB that delivers connectivity to an IO (e.g., an OCP). PCB 12 may be a pluggable device (e.g., a circuit card) that plugs into an expansion slot in a chassis of an information handling system to allow for custom IO connectivity into the box. For example, PCB 12 may support an OCP card or storage devices.

PCB 10 may have multiple components 8 and receive electrical power from power connector 18 connected to wires 20. PCB 10 may have an overall length ($L_1$) that depends partially on providing an area for power connector 18 to connect to PCB 10 and to allow for routing of the electrical power to components 8 on PCB 10.

To protect PCB 10 and/or PCB 12 from physical damage when coupled to board connector 14, board connector 14 may comprise strain relief connectors 16. For example, when PCB 12 is installed in a chassis and board connector 14 is coupled to PCB 12, PCB 10 positioned in a slot (discussed in greater detail below) in board connector 14 and may extend a length ($L_1$) from board connector 14, wherein the portion of PCB 10 near board connector 14 may be under strain due to various forces (e.g., the weight of components 8, power connector 18, power cables 20 and/or the weight of PCB 10 itself).

In some systems, a height of strain relief connector 16 may correspond to the maximum height ($H_1$) of PCB 10. In other systems, a height of power connector 18 may correspond to the maximum height ($H_1$) of PCB 10. However, height $H_1$ may be less than a height ($H_2$) of components (e.g., fins 6) on second PCB 12.

Figure 2:
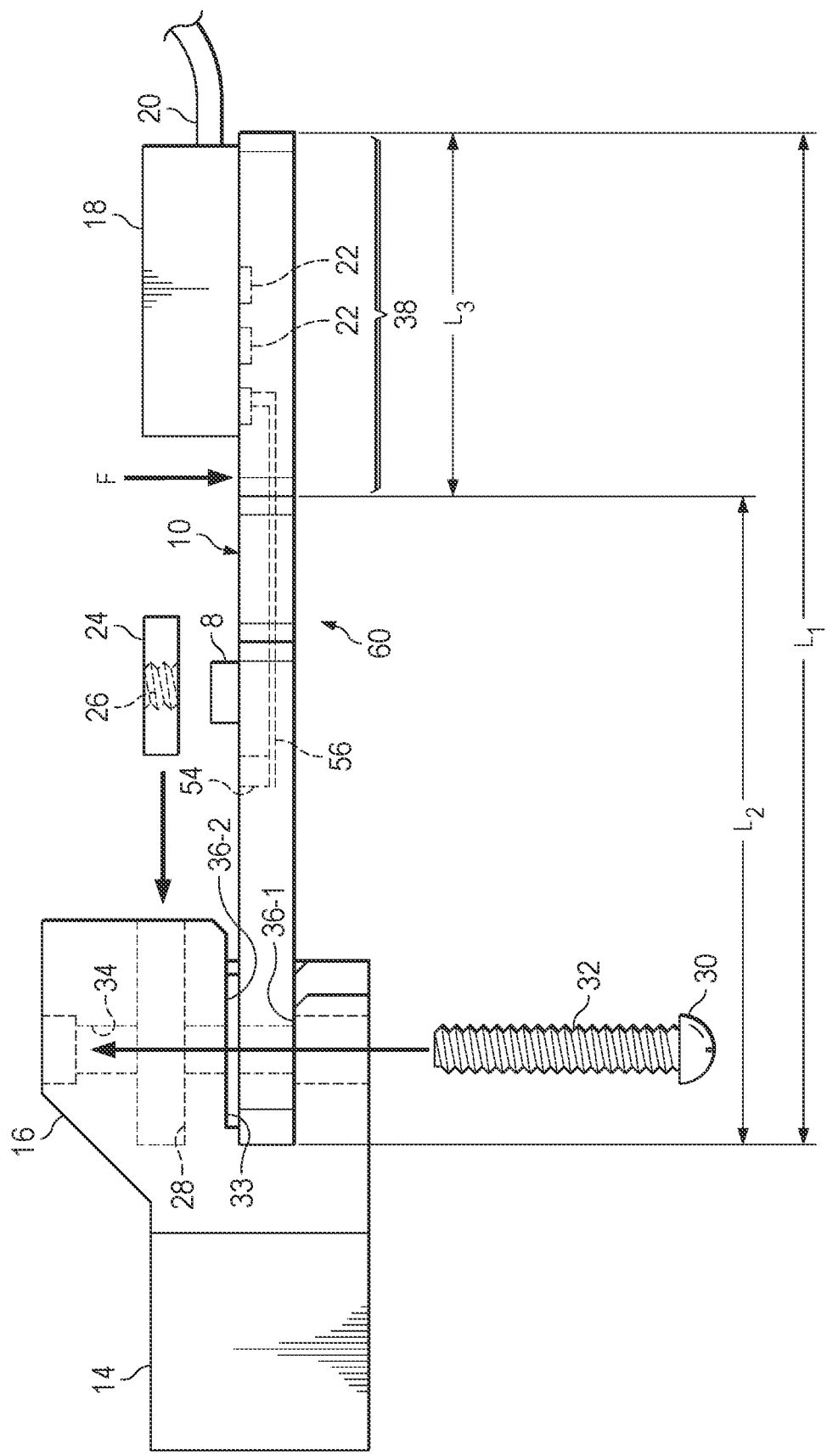
FIG. 2 depicts a side cutaway view of the first PCB and the board connector depicted in FIG. 1, illustrating a strain relief connector on the board connector.

Turning to FIG. 2, a first length ($L_1$) may correspond to a total length of PCB 10, wherein most components 8 and connectors may be located within a second length ($L_2$) (e.g., on a first side of notch 60 closer to board connector 14). Electrical contacts 22 for receiving electrical power from power connector 18 may be located within a third length ($L_3$) (e.g., on a second side of notch 58 farther away from board connector 14) and electrical power received from wires 20 may be routed through power plane 56 and/or via 54 to components 8.

A common approach to protect PCB 10 is to position PCB 10 in a first slot 33 in board connector 14 and advance nut 24 comprising internal threads 26 into second slot 28 in strain relief connector 16. Once PCB 10 is positioned in first slot 33 and nut 24 is positioned in second slot 28, bolt 30 with external threads 32 may be advanced in passage 34 such that external threads 32 on bolt 30 engage internal threads 26 in nut 24. Further advancement of bolt 30 causes strain relief surface 36-1 to contact a bottom surface of PCB 10, securing PCB 10 in first slot 33 in board connector 14 with strain relief surfaces 36 distributing loads to provide strain relief for PCB 10.

Embodiments disclosed herein may leverage existing strain relief connectors 16 to provide an electrical path for supplying electrical power to PCB 10 in addition to providing strain relief.

Figure 3:
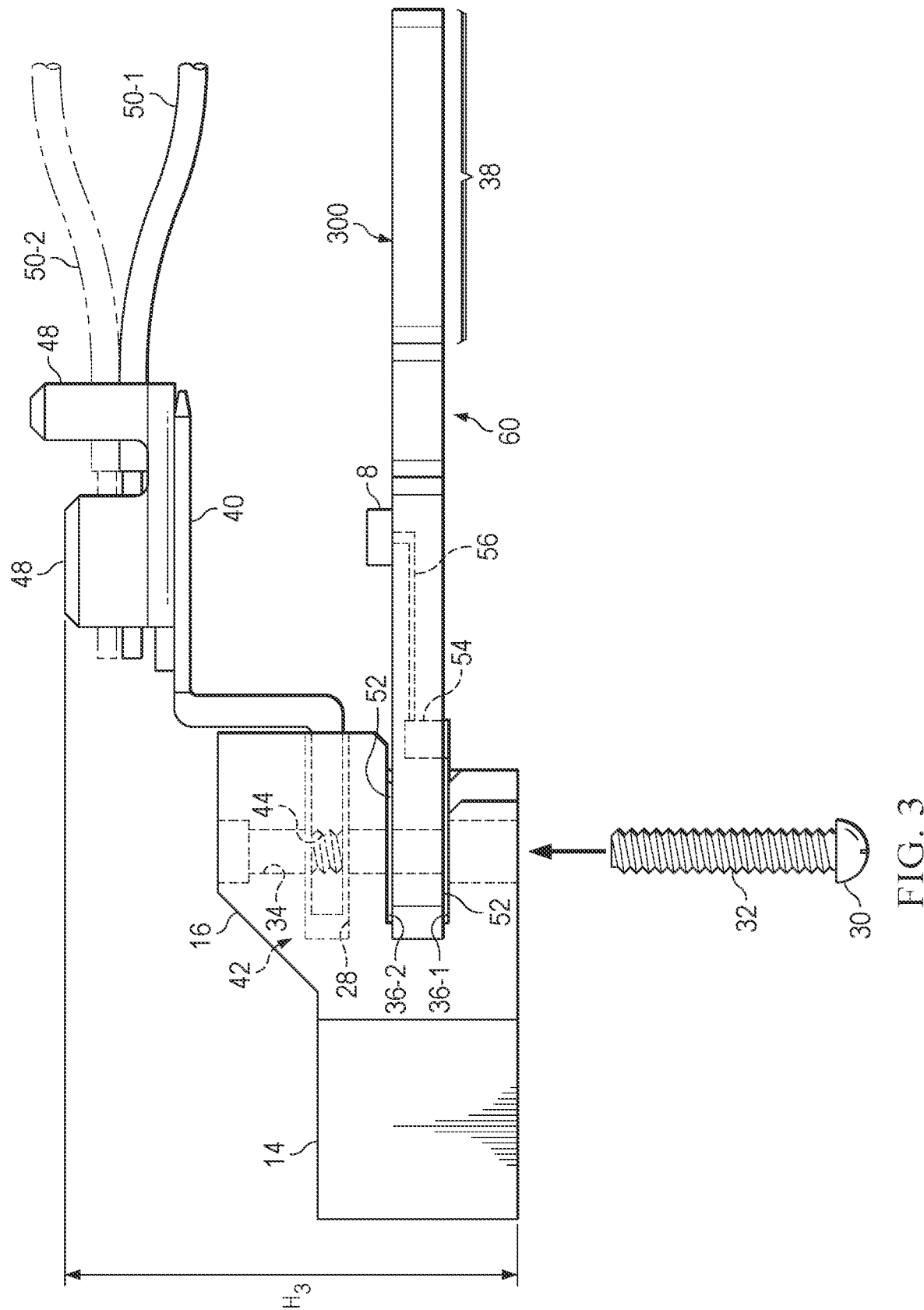
FIG. 3 depicts a side cutaway view of a PCB and a board connector, illustrating a system for providing power to a PCB using a strain relief connector on the board connector, in accordance with some embodiments.

FIG. 3 depicts an embodiment of a system for providing strain relief and electrical power to PCB 300. As depicted in FIG. 3, PCB 300 may be manufactured without power connectors 22 in region 38. Instead, electrical pads 52 may be formed near a first edge of PCB 300 (e.g., an edge expected to be positioned in board connector 14) and connected to via 54.

Still referring to FIG. 3, the first edge of PCB 300 may be advanced in first slot 33 formed in board connector 14 and first end 42 of bracket 40 may be advanced into second slot 28 in strain relief connector 16. Threaded passage 34 in bracket 40 may intersect with first slot 33 and second slot 28 such that advancing bolt 30 in threaded passage 34 causes external threads 32 on bolt 30 to engage internal threads 44 in bracket 40. Further advancement of bolt 30 in threaded passage 34 may cause one or more strain relief surfaces 36-1 and 36-2 to contact electrical pads 52 on PCB 300 such that bracket 40, bolt 30 and electrical pads 52 are electrically connected. Power cable 50-1 may be connected to electrical connectors 48. Thus, an electrical path may be formed such that power travels from power cable 50-1 into electrical connectors 48, along bracket 40 and bolt 30 to electrical pads 52 and to via 54 for routing through PCB 300 to component 8.

Electrical connectors 48 may be any of various types (e.g., rail types, screw types) and extend from bracket 40 in any direction, wherein the direction may be based on one or more of minimizing an overall height of PCB 300, case of connection of power cables 50 to electrical connectors 48, providing access to components 8 or other cables connected to PCB 300 and cooling of an information handling system. Electrical connectors 48 may be configured with a height ($H_3$). In some embodiments, electrical connectors 48 may be configured to extend from bracket 40 in any direction with height ($H_3$) less than height $H_2$ of a component on a second PCB 12 coupled to PCB 300. For example, as depicted in FIG. 3, in some embodiments, electrical connectors 48 may extend in a first direction (e.g., perpendicular to a surface of PCB 300, illustrated as upward relative to the page) to height $H_3$. In other embodiments (not shown), electrical connectors 48 may extend in a second direction (e.g., parallel to a surface of PCB 300 and either parallel with board connector 14 or perpendicular to board connector 14) to ensure height $H_3$ does not exceed height $H_2$. In some chassis configurations (not shown), a second PCB 300 may be positioned above a first PCB 300. In some embodiments, second power cable 50-2 may connect electrical connectors 48 on a first PCB 300 to electrical connectors 48 on a second PCB 300 such that electrical power may be provided to the second PCB 300 (also referred to as "daisy chaining"). Thus, embodiments may result in a fewer number of power cables 50, which may further reduce cost and complexity of PCB 300 and free up space in a chassis.

Figure 4:
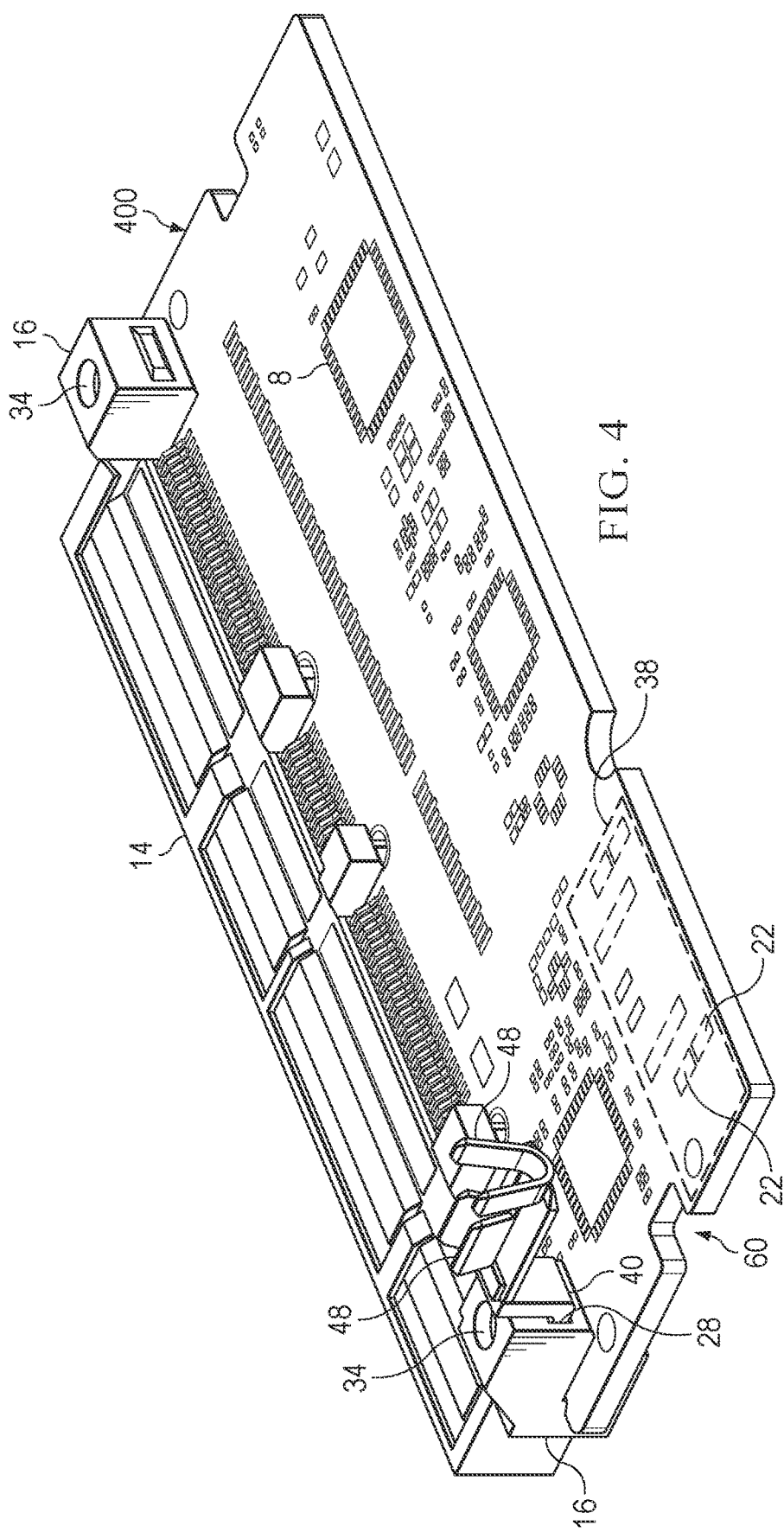
FIG. 4 depicts a perspective view of one embodiment of a system for leveraging a strain relief connector on a board connector to provide power to a PCB.

FIG. 4 depicts an embodiment of a system for providing strain relief and electrical power to PCB 400, which may be similar to PCB 10 depicted in FIG. 1 but modified to allow strain relief connector 16 to provide electrical power to PCB 400. As depicted in FIG. 4, PCB 400 may be a common board design manufactured with power connectors 22 in region 38, wherein power connectors 22 may or may not be used for power. In some embodiments, PCB 400 may be reduced in size for fitting into smaller spaces.

Figure 5:
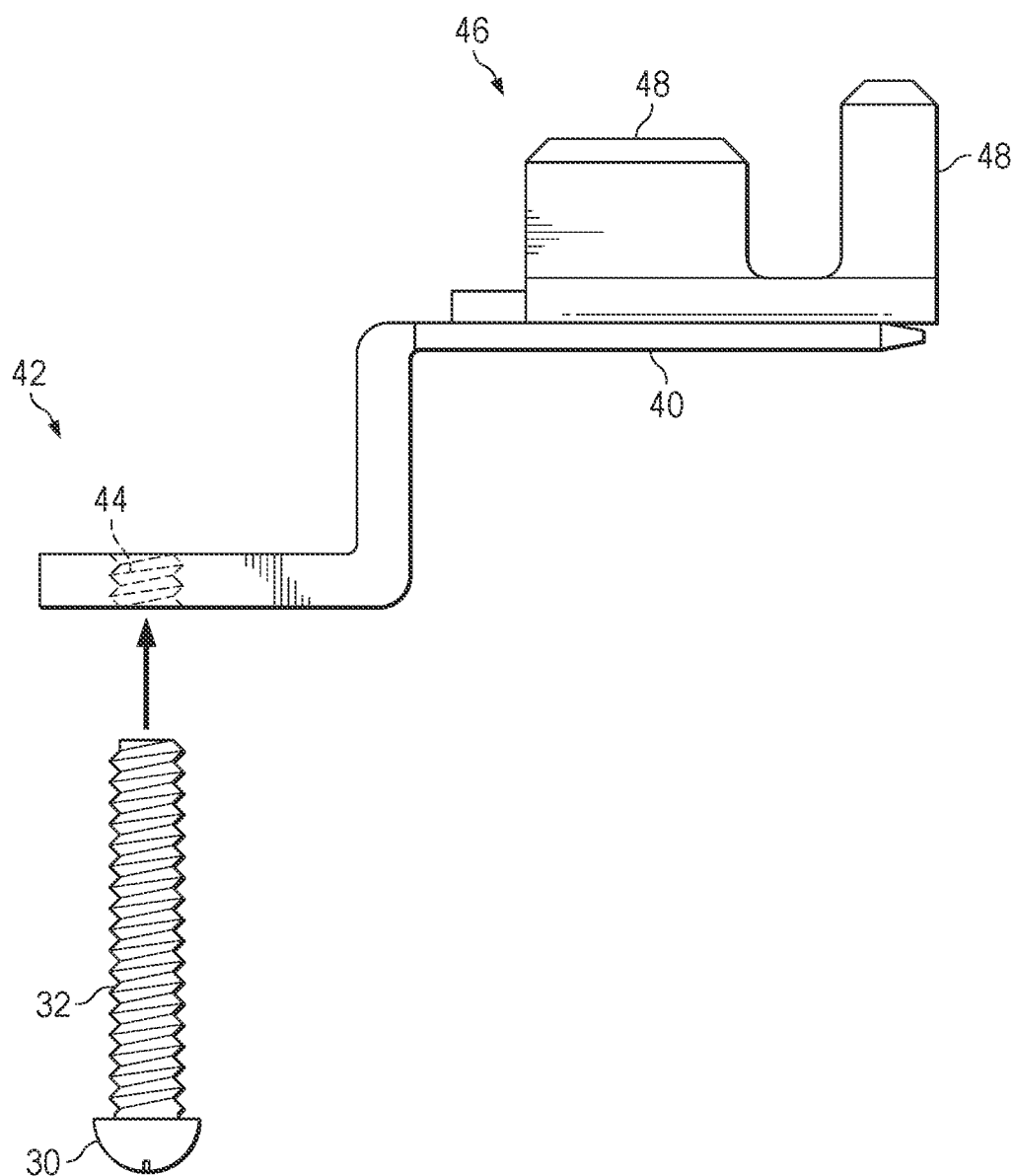
FIG. 5 depicts a side view of one embodiment of a bracket for providing power to the first PCB using the strain relief connector on the board connector, in accordance with some embodiments.

FIG. 5 depicts one embodiment of bracket 40 as part of a system for leveraging strain relief connectors 16 on board connector 14 to provide electrical power to PCB 10 and still provide strain relief for PCB 10. Bracket 40 may have a first end 42 with internal threads 44 for receiving bolt 30 with external threads 32. Bracket 40 may have a second end 46 with electrical connector(s) 48 for receiving electrical power. Bracket 40 may be configured with a shape to provide clearance between electrical connectors 48 and components 8 on PCB 10 and/or clearance relative to another PCB 10. In some embodiments, bracket 40 may be configured with one or more curves or bends to provide an offset clearance between electrical connectors 48 and components 8 on PCB 10 and/or another PCB 10. As depicted in FIG. 5, in some embodiments, bracket 40 may be configured with two bends of substantially ninety-degree angles to provide an offset clearance between second end 46 and PCB 10, and/or an offset clearance between electrical connectors 48 and a second PCB 10 positioned above first PCB 10, and/or an offset clearance between electrical connectors 48 and board connector 14.

Figure 6:
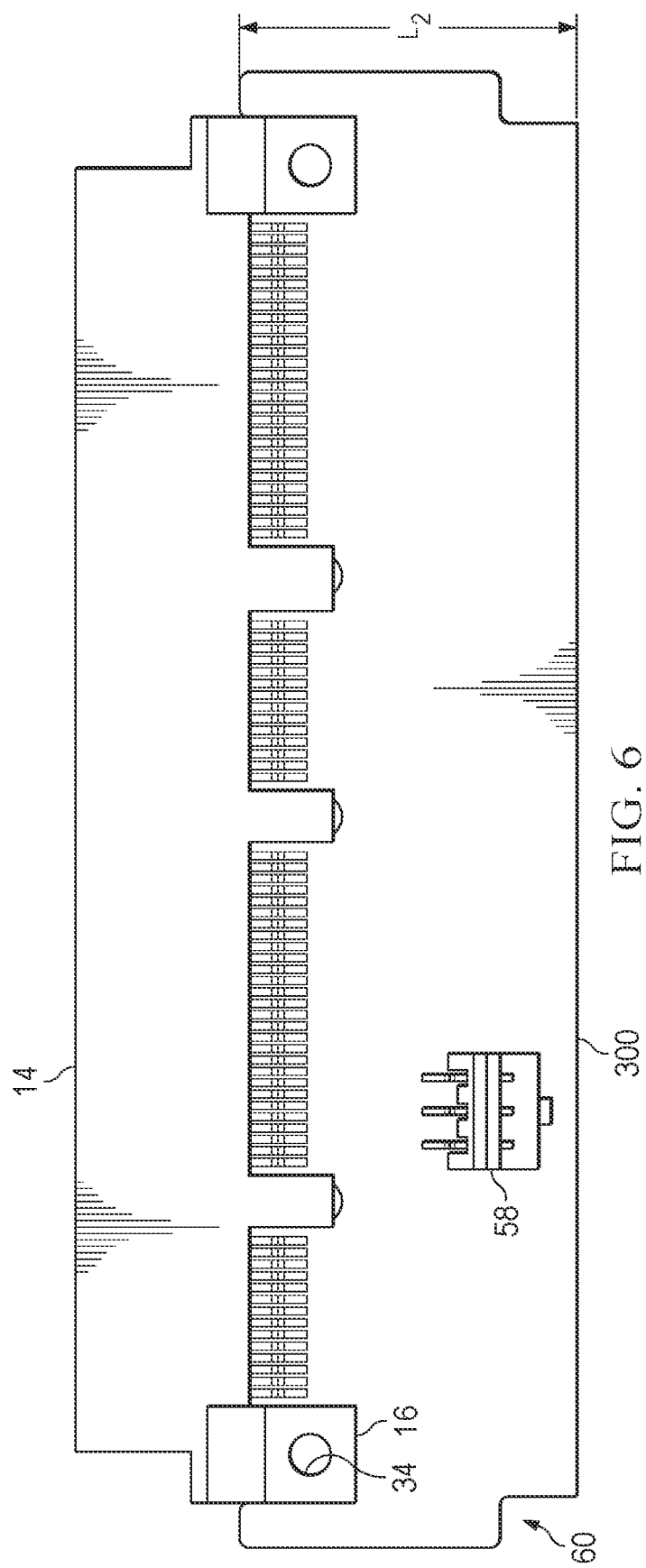
FIG. 6 depicts a top view of a PCB that can receive power from a strain relief connector on a board connector, illustrating that the PCB can be smaller and an arrangement of components on the PCB can be modified based on the location of the electrical connection.

Referring to FIG. 6, by leveraging strain relief connector 16, embodiments may be manufactured with PCB 300 having a total length based on length $L_2$. For example, PCB 300 without section 38 may allow configurations with less routing circuits. Further advancements in components 58 may reduce the area needed for components 58 as well as routing of power to component 58. Also, by connecting power cables 50 to strain relief connector 16, power cables 50 do not apply additional forces on PCB 400, allowing larger cards if needed.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, and a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-Cor. ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more non-volatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for providing electrical power to a one or more printed circuit boards (PCB), the system comprising:
   a power pad formed on a surface of a first PCB;
   a via formed through a portion of the first PCB for electrically connecting the power pad to a power plane in the first PCB;
   a board connector configured to couple the first PCB to a second PCB, wherein the board connector comprises:
      a first slot for receiving a first edge of the first PCB;
      a strain relief connector comprising a second slot aligned substantially parallel with the first slot and a threaded passage orthogonal to and intersecting the first slot and the second slot;
   an electrically conductive bracket comprising:
      a first end for positioning in the second slot; and
      a second end with an electrical connector; and
   a threaded connector, wherein engaging the threaded connector with the threaded passage advances the threaded connector to secure the electrically conductive bracket and the first PCB in the first slot in the board connector, wherein the electrically conductive bracket, the threaded connector, the power pad and the via form an electrical path from the electrical connector to the first PCB.

2. The system of claim 1, wherein the electrical connector comprises one of a rail type connector or a screw type connector.

3. The system of claim 1, wherein the electrical connector is configured to extend in a direction substantially parallel to the surface of the first PCB.

4. The system of claim 1, wherein the electrical connector is configured to extend in a direction substantially perpendicular to the surface of the first PCB.

5. The system of claim 1, wherein the board connector comprises a Small Form Factor (SFF) TA-1002 type connector.

6. The system of claim 1, wherein the first PCB comprises one of an open compute platform (OCP) card or a floating open compute platform (FLOP) card.

7. An information handling system comprising:
   a first printed circuit board (PCB) comprising:
      a power pad formed on a surface of the first PCB; and
      a via formed through a portion of the first PCB for electrically connecting the power pad to a power plane in the first PCB;
   a board connector configured to couple the first PCB to a second PCB, wherein the board connector comprises:
      a first slot for receiving a first edge of the first PCB;
      a strain relief connector comprising a second slot aligned substantially parallel with the first slot and a threaded passage orthogonal to and intersecting the first slot and the second slot;
   an electrically conductive bracket comprising:
      a first end for positioning in the second slot; and
      a second end with an electrical connector; and
   a threaded connector, wherein engaging the threaded connector with the threaded passage advances the threaded connector to secure the electrically conductive bracket and the first PCB in the first slot in the board connector, wherein the electrically conductive bracket, the threaded connector, the power pad and the via form an electrical path from the electrical connector to the first PCB.

8. The information handling system of claim 7, wherein the electrical connector comprises one of a rail type connector or a screw type connector.

9. The information handling system of claim 7, wherein the electrical connector is configured to extend in a direction substantially parallel to the surface of the first PCB.

10. The information handling system of claim 7, wherein the electrical connector is configured to extend in a direction substantially perpendicular to the surface of the first PCB.

11. The information handling system of claim 7, wherein the board connector comprises a Small Form Factor (SFF) TA-1002 type connector.

12. The information handling system of claim 7, wherein the first PCB comprises one of an open compute platform (OCP) card or a floating open compute platform (FLOP) card.

13. A chassis for an information handling system, the chassis comprising:
   a power pad formed on a surface of a first PCB; a via formed through a portion of the first PCB for electrically connecting the power pad to a power plane in the first PCB;
   a board connector configured to couple the first PCB to a second PCB, wherein the board connector comprises:
      a first slot for receiving a first edge of the first PCB;
      a strain relief connector comprising a second slot aligned substantially parallel with the first slot and a threaded passage orthogonal to and intersecting the first slot and the second slot;
   an electrically conductive bracket comprising:
      a first end for positioning in the second slot; and
      a second end with an electrical connector; and
   a threaded connector, wherein engaging the threaded connector with the threaded passage advances the threaded connector to secure the electrically conductive bracket and the first PCB in the first slot in the board connector, wherein the electrically conductive bracket, the threaded connector, the power pad and the via form an electrical path from the electrical connector to the first PCB.

14. The chassis of claim 13, wherein the electrical connector comprises one of a rail type connector or a screw type connector.

15. The chassis of claim 13, wherein the electrical connector is configured to extend in a direction substantially perpendicular to the surface of the first PCB.

16. The chassis of claim 13, wherein the electrical connector is configured to extend in a direction substantially parallel to the surface of the first PCB.

17. The chassis of claim 16, wherein the board connector comprises a Small Form Factor (SFF) TA-1002 type connector.

18. The chassis of claim 16, wherein the first PCB comprises one of an open compute platform (OCP) card or a floating open compute platform (FLOP) card.

* * * * *